United States Patent
Ulrich et al.

(12) 
(10) Patent No.: US 6,424,471 B1
(45) Date of Patent: Jul. 23, 2002

(54) CATADIOPTRIC OBJECTIVE WITH PHYSICAL BEAM SPLITTER

(75) Inventors: Willi Ulrich, Aalen-Dewangen; Helmut Beierl, Heidenheim, both of (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 46 days.

(21) Appl. No.: 09/711,256

(22) Filed: Nov. 10, 2000

(30) Foreign Application Priority Data

Nov. 12, 1999 (DE) .......................................... 199 54 727
Apr. 27, 2000 (DE) .......................................... 100 20 592

(51) Int. Cl.$^7$ .......................... G02B 17/00; G02B 9/00
(52) U.S. Cl. .................. 359/732; 359/649; 359/727
(58) Field of Search ................ 359/649, 727, 359/732

(56) References Cited

U.S. PATENT DOCUMENTS

| | | | |
|---|---|---|---|
| 4,302,079 A | 11/1981 | White | 359/352 |
| 4,896,952 A | 1/1990 | Rosenbluth | 359/638 |
| 5,636,066 A | 6/1997 | Takahashi | 359/726 |
| 5,691,802 A | 11/1997 | Takahashi | 355/53 |
| 5,694,241 A * | 12/1997 | Ishiyama et al. | 359/364 |
| 5,742,436 A * | 4/1998 | Furter | 359/727 |
| 5,771,125 A | 6/1998 | Ishiyama | 359/727 |
| 5,808,805 A | 9/1998 | Takahashi | 359/651 |
| 5,861,997 A * | 1/1999 | Takahashi | 359/727 |
| 5,999,333 A | 12/1999 | Takahashi | 359/726 |
| 2001/0022691 A1 * | 9/2001 | Furter | 359/629 |

FOREIGN PATENT DOCUMENTS

| | | | |
|---|---|---|---|
| DE | 215 179 | 10/1984 | G02B/17/08 |
| DE | 44 17 489 A1 | 11/1995 | G02B/17/08 |
| EP | 0 350 955 A2 | 1/1990 | G02B/17/08 |
| EP | 0 475 020 A2 | 3/1992 | G02B/17/08 |
| EP | 0 602 923 A1 | 6/1994 | G02B/17/08 |
| JP | 2001-154094 A * | 6/2001 | G02B/17/08 |

* cited by examiner

*Primary Examiner*—Georgia Epps
*Assistant Examiner*—David N. Spector
(74) *Attorney, Agent, or Firm*—Ohlandt, Greeley, Ruggiero & Perle, L.L.P,

(57) ABSTRACT

A catadioptric projection objective comprises an object plane, a physical beam splitter, a concave mirror, an image plane, a first objective part, a second objective part, and a third objective part. The first objective part is located between the object plane and the physical beam splitter. The second objective part is located between the physical beam splitter and the concave mirror, and includes at least two divergent lenses. The third objective part is located between the physical beam splitter and the image plane.

50 Claims, 7 Drawing Sheets

Fig.4a

| Number | Radius | Thickness | Glass |
|---|---|---|---|
|  | Infinity | 35.000 |  |
| 1 | Infinity | 0.000 |  |
| 2 | Infinity | 10.000 | SiO$_2$ |
| 3 | −356.062 | 157.473 |  |
| 4 | 452.316 | 20.000 | SiO$_2$ |
| 5 | −207.509 | 15.494 |  |
| 6 | Infinity | 46.000 | SiO$_2$ |
| 7 | Infinity | −46.000 | SiO$_2$ |
| 8 | Infinity | −11.450 |  |
| 9 | 714.294 | −10.000 | SiO$_2$ |
| 10 | −233.153 | −14.053 |  |
| 11 | 11257.822 | −7.319 | SiO$_2$ |
| 12 | 5681.926 | −0.267 |  |
| 13 | −294.457 | −29.996 | SiO$_2$ |
| 14 | 2624.912 | −21.085 |  |
| 15 | 118.549 | −6.000 | SiO$_2$ |
| 16 | 372.661 | −9.645 |  |
| 17 | 89.531 | −6.000 | SiO$_2$ |
| 18 | 220.679 | −3.803 |  |
| 19 | 134.415 | 3.803 |  |
| 20 | 220.679 | 6.000 | SiO$_2$ |
| 21 | 89.531 | 9.645 |  |
| 22 | 372.661 | 6.000 | SiO$_2$ |
| 23 | 118.549 | 21.085 |  |
| 24 | 2624.912 | 29.996 | SiO$_2$ |
| 25 | −294.457 | 0.267 |  |
| 26 | 5681.926 | 7.319 | SiO$_2$ |
| 27 | 11257.822 | 14.053 |  |
| 28 | −233.153 | 10.000 | SiO$_2$ |
| 29 | 714.294 | 11.450 |  |

Fig.4b

| Number | Radius | Thickness | Glass |
|---|---|---|---|
| 30 | Infinity | 46.000 | SiO$_2$ |
| 31 | Infinity | 46.000 | SiO$_2$ |
| 32 | Infinity | 0.000 | |
| 33 | Infinity | 11.000 | |
| 34 | −6197.720 | 20.000 | SiO$_2$ |
| 35 | −220.468 | 289.683 | |
| 36 | Infinity | 35.000 | |
| 37 | 283.114 | 27.145 | SiO$_2$ |
| 38 | −291.549 | 0.100 | |
| 39 | 169.089 | 12.856 | SiO$_2$ |
| 40 | 2565.581 | 24.511 | |
| 41 | −380.925 | 6.000 | SiO$_2$ |
| 42 | −3955.807 | 18.475 | |
| 43 | −360.725 | 6.000 | SiO$_2$ |
| 44 | −890.059 | 2.723 | |
| 45 | 179.574 | 11.560 | SiO$_2$ |
| 46 | 339.906 | 16.696 | |
| 47 | 147.862 | 16.312 | SiO$_2$ |
| 48 | 65.737 | 18.352 | |
| 49 | −103.682 | 7.718 | SiO$_2$ |
| 50 | −197.447 | 2.785 | |
| 51 | −111.946 | 15.000 | SiO$_2$ |
| 52 | −106.336 | 38.908 | |
| 53 | 152.811 | 22.411 | SiO$_2$ |
| 54 | −194.069 | 0.375 | |
| 55 | 199.667 | 7.318 | SiO$_2$ |
| 56 | 93.342 | 30.484 | |
| 57 | −89.837 | 7.125 | SiO$_2$ |
| 58 | −197.820 | 35.858 | |
| 59 | 713.001 | 13.228 | SiO$_2$ |
| 60 | −274.158 | 0.375 | |
| 61 | 106.260 | 6.375 | SiO$_2$ |

Fig.4c

| Number | Radius | Thickness | Glass |
|---|---|---|---|
| 62 | 76.991 | 18.205 | |
| 63 | 207.243 | 16.125 | SiO$_2$ |
| 64 | −265.976 | 0.375 | |
| 65 | 105.981 | 6.937 | SiO$_2$ |
| 66 | 70.150 | 5.069 | |
| 67 | 110.354 | 11.250 | SiO$_2$ |
| 68 | 337.355 | 1.500 | |
| 69 | Infinity | 0.000 | |
| 70 | 83.053 | 13.500 | SiO$_2$ |
| 71 | 64.019 | 0.100 | |
| 72 | 60.890 | 13.500 | SiO$_2$ |
| 73 | 102.439 | 0.100 | |
| 74 | 65.465 | 8.392 | SiO$_2$ |
| 75 | 75.287 | 0.523 | |
| 76 | 74.115 | 10.249 | SiO$_2$ |
| 77 | 48.411 | 4.971 | |
| 78 | 70.660 | 26.249 | SiO$_2$ |
| 79 | −135.364 | 0.037 | |
| 80 | 38.280 | 23.827 | CaF$_2$ |
| 81 | 41.066 | 0.037 | |
| 82 | 46.927 | 9.291 | CaF$_2$ |
| 83 | −187.500 | 5.625 | |
| 84 | Infinity | 0.000 | |
| IMG: | Infinity | 0.000 | |

CATADIOPTRIC OBJECTIVE WITH PHYSICAL BEAM SPLITTER

BACKGROUND OF THE INVENTION

1. Field of the Invention

The invention concerns a catadioptric projection objective with an object plane, a physical beam splitter, a concave mirror, a image plane, a first objective part, a second objective part, as well as a third objective part.

2. Description of the Prior Art

Optical projection systems with great resolution are used for projection exposure devices, with which patterns of photomasks or reticles, which are designated below generally as masks or reticles, are projected or exposed on semiconductor wafers or glass plates coated with photosensitive materials. In order to further reduce the structural width, which is essentially limited by the diffraction-limited resolution, preferably DUV and VUV radiation with a wavelength $\leq 260$ nm are used for projection of such small structures. Catadioptric systems are used for such projection devices as projection objectives, among others. Catadioptric systems permit a large bandwidth, whereby the costs of the laser exposure source can be kept small and the efficiency is high.

A catadioptric projection system with intermediate image has been made known from U.S. Pat. No. 5,636,066. Beam splitting is produced geometrically by means of a deflecting mirror, which is perforated in the center of the mirror, and represents a diaphragm for the beam reflected by the catadioptric part at the concave mirror.

The system according to U.S. Pat. No. 5,636,066 is constructed in such a way that the intermediate image is formed in the diaphragm plane of the deflecting mirror.

Another system with geometric beam splitter, which is designed as a deflecting mirror, has become known from U.S. Pat. No. 5,691,802. In the projection objective known from U.S. Pat. No. 5,691,802 with an intermediate image, the intermediate image is formed in front of the catadioptric objective in the first objective part. A disadvantage of the system known from U.S. Pat. No. 5,691,802 is the fact that this necessarily involves an eccentric system due to the geometric beam splitting.

A system with a physical beam splitter has become known from EP-A-0 475,020. The system shown in EP-A 0 475,020 comprises at least one catadioptric input system as well as a dioptric output system. The mask to be imaged is applied directly onto a beam splitter, which is preferably a prism. A part of the light reflected by the catadioptric system is deflected to the dioptric system by means of the beam splitter.

A disadvantage of the arrangement according to EP-A 0 475,020 is the fact that the object to be imaged is arranged directly on the beam splitter and the correction of the intermediate image limits the possibilities for correction of the entire system.

U.S. Pat. No. 4,302,079 is shows a system with a polarization-optical beam splitter. The change of the direction of polarization of the beam reflected by the concave mirror in the catadioptric objective part is varied by means of induced double refraction.

U.S. Pat. No. 4,896,952 shows a system with polarization-optical beam splitter, whereby the change of the direction of polarization in the catadioptric objective part is achieved by means of a $\lambda/4$ plate.

DD-C-215,179 also shows a system with a physical beam splitter, which is formed as a partially transparent beam-splitting prism. The system according to DD-C-215,179 has two identical mirrors on two of the four sides of the beam-splitting prism perpendicular to a pregiven plane as well as two dioptric structural groups on the other two sides of the beam splitting prism. The dioptric structural groups are designed in such that the Petzval sum of the two systems largely compensates for that of the mirror.

A catadioptric projection objective without intermediate image has become known from EP-A 0 350,955, in which a first lens group or a first objective part is provided between the object, e.g., the reticle, and the physical beam splitter, a second lens group is provided between the physical beam splitter and the concave mirror, and a third lens group is provided between the physical beam splitter and the image plane.

U.S. Pat. No. 5,808,805 and U.S. Pat. No. 5,999,333 show a catadioptric objective with intermediate image and beam splitter as well as at least two partial objectives, whereby the partial objectives are constructed such that the intermediate image lies in the vicinity of the beam splitter surface of the physical beam splitter. According to U.S. Pat. No. 5,808,805, a physical beam splitter, for example, a beam-splitting prism, is used as the beam splitter; U.S. Pat. No. 5,999,333 also shows the use of a mirror as a geometric beam splitter.

A disadvantage of the system with a geometric beam splitter is the fact that this involves an eccentric system. Both the system known from U.S. Pat. No. 5,808,805 as well as that from U.S. Pat. No. 5,999,333 have a very high range of angle of incidence of the returning beams reflected by the concave mirror and impinging on the surface of the beam splitter.

U.S. Pat. No. 5,861,997 shows a system similar to U.S. Pat. No. 5,808,805 as well as of U.S. Pat. No. 5,999,333 with two intermediate imaging systems, whereby one intermediate image lies in the vicinity of the beam splitter, so that high angles of incidence occur at the beam splitter.

The main disadvantage of the objectives known from U.S. Pat. No. 4,302,079; U.S. Pat. No. 4,896,952; EP-A-0 350,955; DD-C-215,179; U.S. Pat. No. 5,808,805; U.S. Pat. No. 5,861,997; and U.S. Pat. No. 5,999,333 is the fact that the beams impinging on the beam splitter layer have a broad range of angles. This is true particularly for the embodiments shown in U.S. Pat. No. 5,808,850; U.S. Pat. No. 5,861,997; and U.S. Pat. No. 5,999,333, in which the intermediate image is formed in the vicinity of the beam-splitter surface.

The image quality is reduced by the large range of angles of the radiation impinging on the beam-splitter layer, since the reflectivity and the transmission of the beam-splitter layer depend on the angle of incidence onto the beam-splitter layer and insofar different intensity distributions result for different incidence angles.

In order to avoid this disadvantage, EP-A-0 602,923 proposes providing a lens in front of the physical beam splitter, by means of which the radiation impinging on the beam splitter is made parallel.

A parallel beam path is also produced in the catadioptric projection system known from U.S. Pat. No. 5,771,125. A disadvantage of the objectives according to EP-A 0 602,923 and U.S. Pat. No. 5,771,125 is that the positive refractive power of the mirror is not compensated for in the catadioptric part. This means that in fact, the beam impinging on the beam-splitter layer is made parallel, but not the beam returning after reflection at the concave mirror. The beam-splitter layer is then loaded in a direction under larger aperture angles. This in turn has the consequence that a pure splitting into the polarization directions cannot be achieved. Double images and a loss of contrast result from this.

In order to minimize the angle of incidence onto the beam-splitter layer, DE-A 4,417,489 proposes arranging at least one convergent lens for making the light beam impinging on the beam-splitter layer parallel in the case of a catadioptric projection system with physical beam splitter on the object side in front of the physical beam splitter, and a divergent lens group with one divergent lens after the physical beam splitter in the catadioptric objective part, in order to compensate for the effect of the convergent lens for making the beam impinging on the beam-splitter layer parallel. Further, another convergent lens is provided on the image side after the beam-splitter prism, in order to compensate for the effect of the divergent lens group in the case of a beam returning from the concave mirror in double passage.

The disadvantage of the arrangement according to DE-A 4,417,489 is the fact that the correction of longitudinal chromatic aberration (CHL) is insufficient due to the over-correcting catadioptric objective part.

SUMMARY OF THE INVENTION

A first object of the invention is thus to provide a catadioptric projection objective, which overcomes the disadvantages of DE-A 4,417,489, and particularly allows for a complete correction of the longitudinal chromatic aberration (CHL). According to the invention, this object is solved in a first embodiment by a projection system, in which more negative refraction power is arranged in the second objective part between beam splitter and concave mirror. A splitting of this high negative refraction power into at least two negative lenses is advantageous.

In an alternative embodiment, the second objective mirror is over-corrected relative to the chromatic length aberration CHL, while the first and third objective parts provide an under-correction, so that the over-correction of the second objective part in double passage compensates for the under-correction of the first and third objective parts up to at least 70% and preferably to more than 85%.

The advantages of such a projection objective are:
a. the correction of the of longitudinal chromatic aberration (CHL) is no longer limited;
b. the working distance between both the object plane and the first objective part as well as between the third objective part and the image plane is sufficient for an application in microlithography;
c. a double parallel beam path is produced on the beam-splitter surface both in passage to the concave mirror as well as in the return from the concave mirror;
d. the entire system can be constructed on-axis;
e. in the design with intermediate image, a conjugated, accessible diaphragm plane can be provided in the third objective part.

In a first embodiment of the optical system, the divergent lenses of the second objective part are spatially separated from one another.

A polarization-optical beam splitter with polarization-dependent reflecting layer system is preferably used as the physical beam splitter. The use of obliquely positioned planar plates would also be possible.

It is particularly preferred if the physical beam splitter is formed approximately in cube shape, i.e., the side ratio $A_1:B_1$ of the surface of the physical beam splitter pointing to the object is in the range of $0.7<A_1:B_1 \leq 1.0$ and the side ratio $A_2:B_2$ of the surface pointing to the wafer also lies in the range of $0.7<A_2:B_2 \leq 1.0$.

A particularly good imaging quality is achieved, if the second objective part and the concave mirror as well as the physical beam splitter are arranged in vicinity to the system aperture.

If the system is configured as a system with intermediate image, then advantageously the entire objective part has an imaging scale $\beta_{intermediate}$ of 1±0.7, preferably 1.5, from the object up to the intermediate image, thus the first as well as the second objective parts and concave mirror in double passage and the third objective part up to the intermediate image.

In order to focus the principal beam to the vertex of the concave mirror, it is advantageously provided that the first objective part comprises a field lens.

A reduction of the structural length of the objective results if one or more deflecting mirrors are provided. A deflecting mirror arranged after the physical beam splitter in the third objective part is preferred. Advantageously, the reticle and wafer are made parallel by introducing a deflecting mirror. A reduction in the number of lenses in the third objective part can be achieved, if aspherical surfaces are provided in the third objective part. This is true also for the second objective part and the first objective part comprising the field lens. An arrangement of the deflecting mirror in the first objective part would also be possible.

In a particularly advantageous embodiment the catadioptric projection objective is formed with intermediate image and has a telescopic configuration with a convergent lens in the first objective part in front of the physical beam splitter, a divergent lens, and a convergent objective after the physical beam splitter in the third objective part and in front of the intermediate image, in order to largely making parallel the radiation impinging on the beam-splitter layer.

BRIEF DESCRIPTION OF THE DRAWINGS

The invention will be described in the following on the basis of the figures, as an example. Here:

FIGS. 3a–3c show the longitudinal spherical aberration, the astigmatic field course, and the distortion of the example of embodiment according to FIG. 2a; and FIGS. 4a–4c is a table of select characteristics of the catadioptric objective shown in FIG. 2a.

DESCRIPTION OF THE INVENTION

Figure 1:
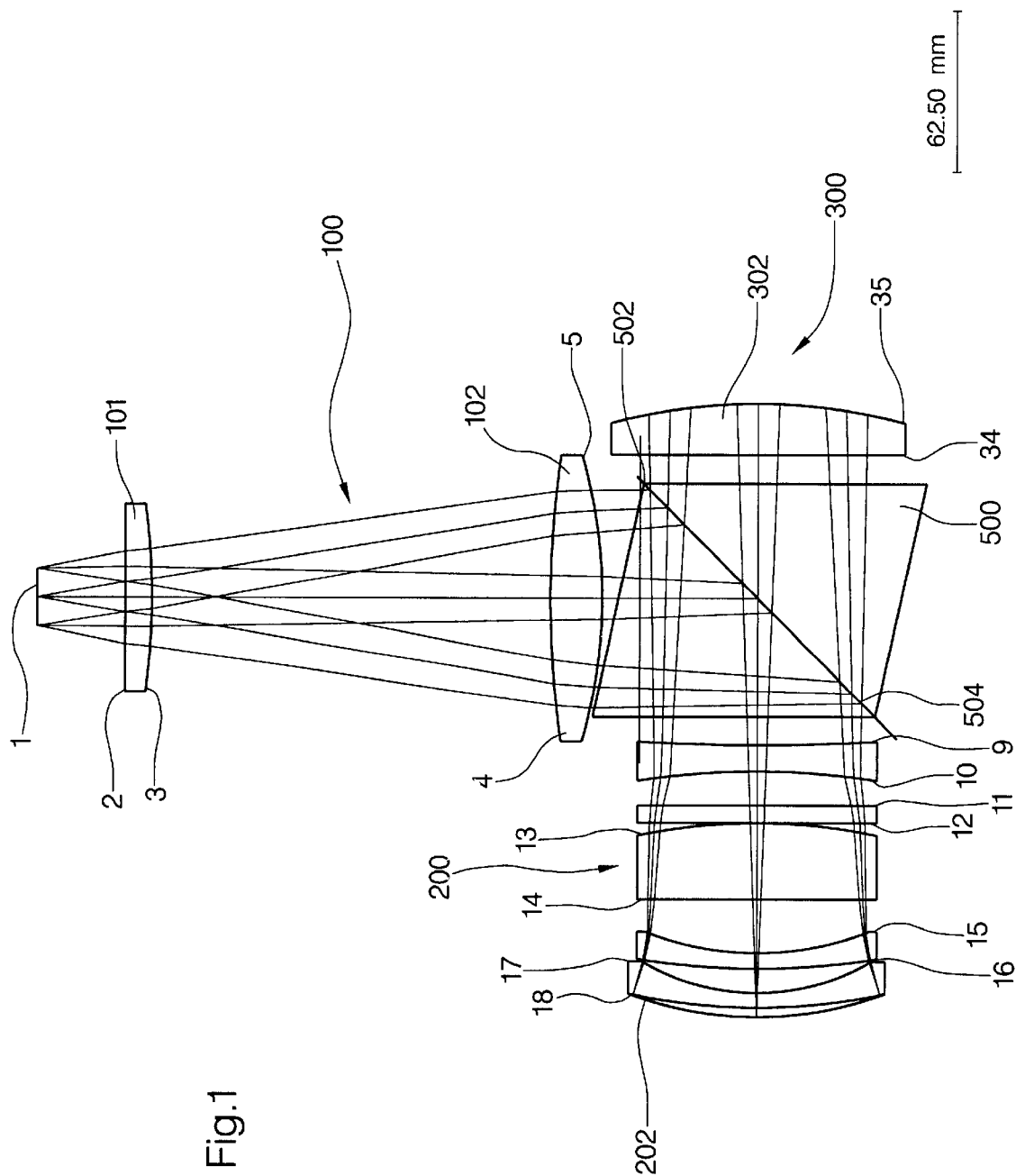
FIG. 1 shows a part of a catadioptric objective as shown in FIG. 2a in the region of the beam splitter.
Figure 2A:
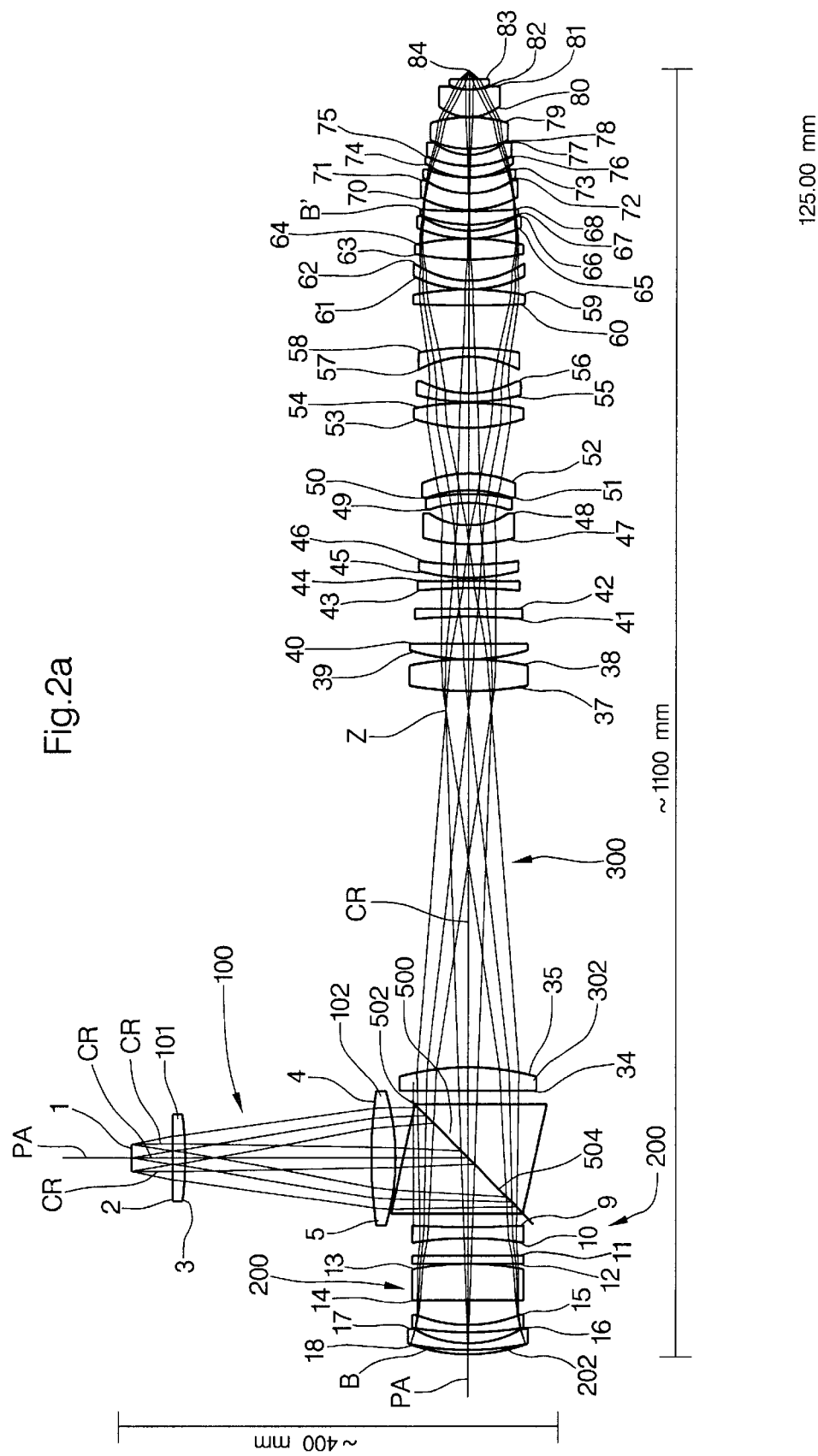
FIG. 2a shows an example of embodiment of a catadioptric objective with intermediate image and third objective part, which is formed as a reduction objective.

Part of the catadioptric projection objective completely shown in FIG. 2a is shown in FIG. 1 and in fact, this figure shows the first objective part 100 including convergent lenses 101, 102, with surfaces 2, 3, 4, 5; the beam-splitter prism 500; the second objective part 200 comprising three divergent lenses as well as two convergent lenses with surfaces 9, 10, 11, 12, 13, 14, 15, 16, 17, 18 in the first passage as well as surfaces 20, 21, 22, 23, 24, 25, 26, 27, 28, 29 in the second passage; the concave mirror 202 with surface 19, which does not belong to the second objective part as well as the convergent lens 302 of the third objective part 300 with surfaces 34, 35, arranged in front of the intermediate image.

Convergent lens 102 in the first objective part 100 serves for the purpose of largely making parallel the beams arriving from object 1, so that only a small variation of the angle of incidence of the impinging beams 504 is present in the region of the beam-splitter layer 502. The refractive elements in the second objective part with their divergent effect largely compensate the effect of convergent lens 102, which makes the radiation impinging on beam-splitter layer 504 parallel, and provides for a divergent beam bundle impinging on concave mirror 202.

The beam-splitter prism is preferably a polarization-optical beam-splitter prism 500, i.e., the incident light is p-polarized, for example. The light reflected by concave mirror 202 upon return passes a element for rotating the polarization, for example, a λ/4 plate, and then has, for example, s-polarization, which is not reflected, but is rather transmitted by the polarization-optical beam-splitter layer 504. The beams transmitted at the polarization-optical beam-splitter layer 504 arrive in the third objective part, of which only the convergent lens 302 in front of the intermediate image is shown in FIG. 1. The sequence of the reflecting, transmitting beam splitter layer can also be reversed. In order to compensate for the effect of the divergent group with lens surfaces 10, 15 and 17 in the second objective part upon return after reflection at concave mirror 202, at least one convergent lens 302 is provided in front of the intermediate image in the third objective part. By this configuration, the angle load on beam-splitter layer 504, i.e., the variation of the angle of incidence both in arriving from object 1 at concave mirror 202 as well as in the return from concave mirror 202 to image 1000 can be kept small. The absolute amount of the refractive power of second objective part 200 preferably amounts to 40–80% of the refractive power of concave mirror 202. The focal length of the second objective part 200 in double passage and of concave mirror 202 has at least triple the value of the free diameter of concave mirror 202.

Preferably, the angles of the chief rays as well as also of the rim rays relative to the optical axis are smaller than 10°, especially smaller than 5° at the beam splitter in air.

An obliquely positioned beam-splitter plate would also be possible instead of the beam-splitting prism.

It is particularly preferred if the beam-splitter prism is formed such, that the side ratio $A_1:B_1$ of the surface pointing to object 1 is in the range of $0.7<A_1:B_1 \leq 0.1$. Preferably, the side ratio $A_2:B_2$ of the surface of the beam-splitter prism pointing to the third objective part lies in the range of $0.7<A_2:B_2 \leq 1.0$.

A projection objective according to the invention is shown in FIG. 2a. This involves a projection objective with intermediate image Z. The same components as in FIG. 1 are given the same reference numbers.

The system according to FIG. 2a comprises a first objective part 100, a second objective part 200, a concave mirror 202 as well as a third objective part 300, in which the intermediate image Z comes to lie. In the above depicted case the projection objective, is a 4:1 reduction objective. Reduction objectives with an imaging scale other than a 4:1 are also possible. The object, e.g., reticle, lies at 1, and the image on the wafer lies at 84. FIGS. 4a–4c gives the radii and the distances of all optically effective surfaces 2–83. Surfaces 2–5 lie in the first objective part 100, whereby surfaces 6–8 characterize the beam-splitter surfaces for forward passage, surfaces 9–18 denote the surfaces in the second objective part 200 in forward passage, surface 19 indicates the concave mirror, surfaces 20–29 denote the surfaces in second objective part 200 in return passage, surfaces 30–32 indicate the beam-splitter surfaces in return passage, and surfaces 34–35, 37–68 and 70–83 indicate the surfaces in the third objective part 300. 36 denotes the intermediate image and 69 indicates the conjugated diaphragm. The free working distance on the object side (0–1) amounts to more than 30 mm and on the wafer side (83–84) to more than 5 mm. The numerical aperture NA lies at 0.7.

The first objective part 100 in the embodiment shown comprises a field lens 101 with surfaces 2, 3, which serve for focusing the chief ray onto the vertex of the concave mirror.

The embodiment according to FIG. 2a comprises two conjugated diaphragm planes due to the intermediate image. One of these, i.e., diagram plane B, lies on concave mirror 202, while the second diaphragm plane B' lies in the third objective part in front of lens surface 70. Since the second diaphragm B' in the third objective part is easily accessible, the diaphragm is preferable used as the system diaphragm.

The embodiment according to FIG. 2a is designed for 193-nm wavelength without limitation. The design concept that is the basis for this example of embodiment can also be utilized in the case of other wavelengths, particularly for 157 nm.

The first and third objective parts are under-corrected relative to the chromatic length aberration (CHL) and the second objective part is over-corrected in double passage. The under-correction of the first and third objective parts will be over-corrected by the second objective part in the present embodiment. The following applies:

$$2*(CHL_{objective\ part\ 2}) = -106\% *(CHL_{objective\ part\ 1} + CHL_{objective\ part\ 3})$$

The second objective part in double passage is over-corrected relative to the Petzval sum and the first and third objective parts are under-corrected, whereby the following is valid:

$$2*(Petzval\ sum_{objective\ part\ 2}) + Petzval\ sum_{concave\ mirror} = -(90\ to\ 110)\% *(Petzval\ sum_{objective\ part\ 1} + Petzval\ sum_{objective\ part\ 3}).$$

The following results for the example of embodiment shown in FIG. 2a:

$$2*(Petzval\ sum_{objective\ part\ 2}) + Petzval\ sum_{concave\ minor} = 0.025087$$

and $$(Petzval\ sum_{objective\ part\ 1} + Petzval\ sum_{objective\ part\ 3}) = -0.025094$$

i.e., the under-correction of the first and third objective part is compensated to at least 90% by the over-correction of the second objective part and concave mirror.

The refractive power of the concave mirror amounts to 0.01488 mm$^{-1}$ and the refractive power of the second objective part amounts to −0.00866 mm$^{-1}$. The focal length of second objective part 200 in double passage and of concave mirror 202 is 622.8 mm in the present embodiment; the free diameter of the concave mirror is approximately 100 mm.

The imaging scale of the projection objective up to the intermediate image amounts to $\beta_{intermediate} = 1.5$.

For easier correction of imaging errors, the entire projection objective is designed as a so-called on-axis system, i.e., the chief rays (CR) are symmetric to the principal axes (PA) of the system, as shown in FIG. 2a.

In order to shorten the structural length of approximately 1.1 m of the objective, in another form of embodiment of the invention, a deflecting mirror after the beam splitter and in front of the intermediate image Z can be arranged. Introducing a deflecting mirror in front of the beam splitter would also be possible. By introducing a deflecting mirror, the reticle and wafer position can be made parallel.

Figure 2B:
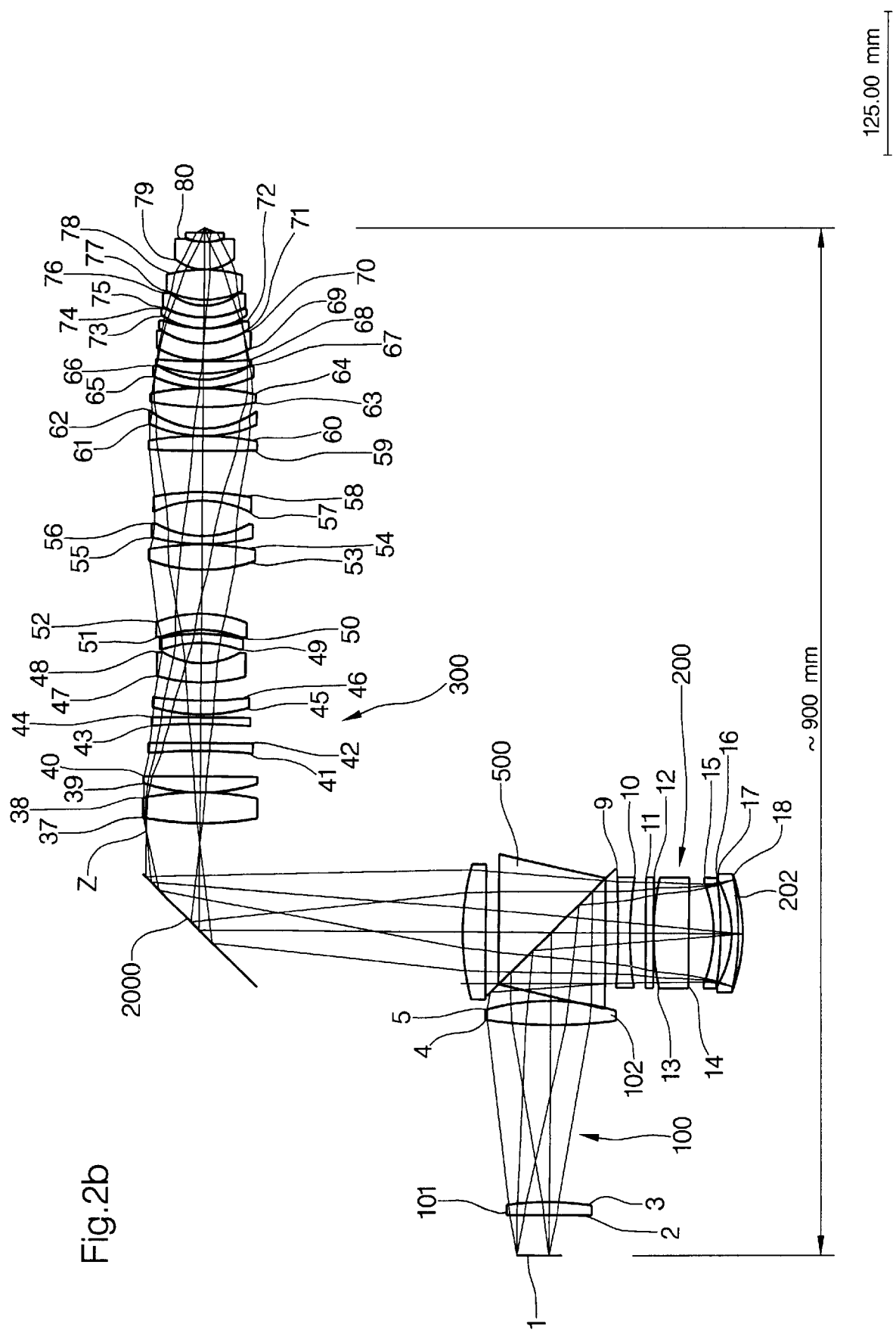
FIG. 2b shows a form of embodiment of a catadioptric objective with intermediate image and deflecting mirror.

Such embodiment is shown in FIG. 2b. The same components as shown in FIG. 2a, particularly the same lens surfaces, are indicated with the same reference numbers. Deflecting mirror 2000 can be clearly seen. The total length of this form of embodiment amounts to approximately 0.9 m.

The numerical aperture of the projection objective shown in FIG. 2b also amounts to NA=0.7.

FIGS. 4a–4c gives the values of an example of an lens system according to the invention shown in FIG. 2a, wherein the consecutive numbers indicate the numbers of the system surface or lens surface, which correlate with the reference numbers in FIGS. 2a and 2b; "radius" gives its radius; "thickness" gives its thickness; and "glass" is to be understood as the material used. $SiO_2$ is quartz glass, $CaF_2$ is calcium fluoride single crystal.

Figure 3C:
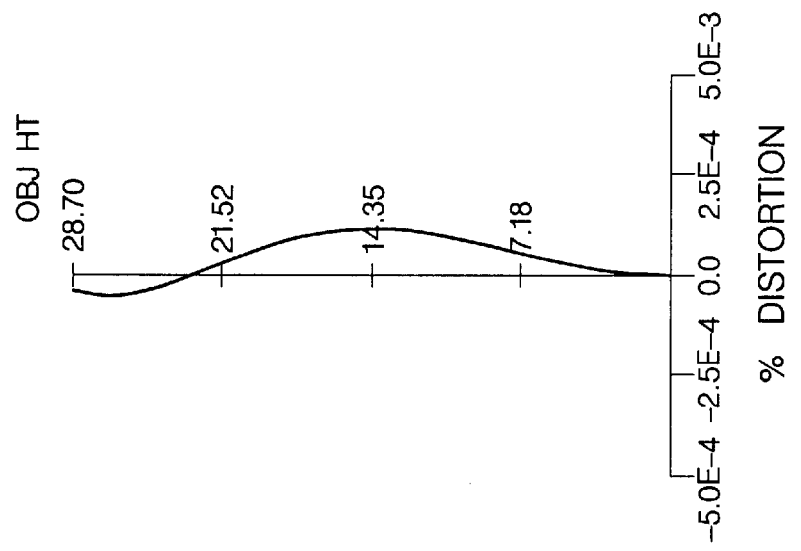
Figure 3B:
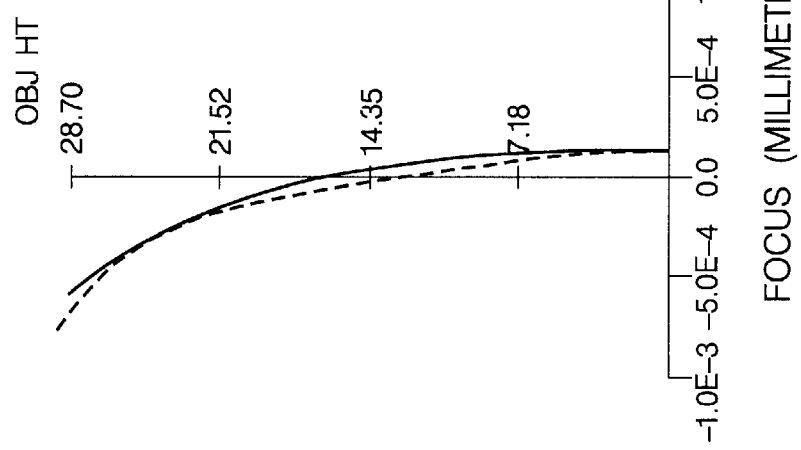
Figure 3A:
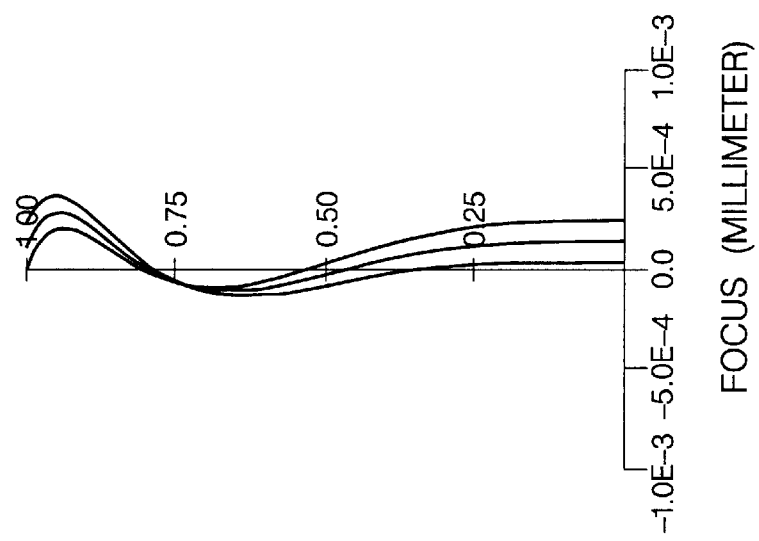

FIG. 3a shows the longitudinal spherical aberration that results for the example of embodiment according to FIGS. 4a–4c; FIG. 3b gives the astigmatism as a function of the height of the object and FIG. 3c gives the distortion as a function of the object height.

The embodiment was corrected chromatically as described above by negative lenses with high beam height in front of the concave mirror as well as by the use of a second material. A broadband design for 193 nm was achieved in this way, i.e., with a bandwidth of $\Delta\lambda=20$ pm, the chromatic length deviation amounts to only 0.22 $\mu$m. A relatively large bandwidth can also be achieved with the use of only one material, e.g., $CaF_2$ for 157 nm, by the negative lenses in front of the mirror, when compared with a purely refractive system alone.

The catadioptric projection objective can be constructed such that it comprises a lens that passes a beam of light having a wavelength ($\lambda$), and where the lens is comprised of a material based on the wavelength ($\lambda$) in accordance with the following guidelines.
(1) For $180 \leq \lambda \leq 250$ nm, particularly for wavelengths of 193 nm and 248 nm, $SiO_2$ is a suitable material for the lens.
(2) For $150 \leq \lambda \leq 200$ nm, particularly for wavelengths of 157 nm and 193 nm, $CaF_2$ is a suitable material for the lens.
(3) For $\lambda < 160$ nm, particularly for a wavelength of 157 nm, alkali fluoride is a suitable material for the lens.
(4) For 150 nm $\leq \lambda \leq 250$ nm, particularly for wavelengths of 157 nm, 193 nm, and 248 nm, the lens material can be any of $SiO_2$, $CaF_2$, or BaF, and combinations thereof.

A projection objective has been provided for the first time for an on-axis system, in which the disadvantages of known systems with physical beam splitter are avoided. The system is particularly characterized by the fact that the correction of the longitudinal chromatic aberration CHL is no longer limited, the working distance both between the object plane and the first objective part as well as between the third objective part and the image plane is sufficient for an application in microlithography and a double parallel beam path is produced on the surface of the beam splitter both in the passage to the concave mirror as well as also in the return from the concave mirror.

It should be understood that various alternatives and modifications can be devised by those skilled in the art. For example, the subject matter of any of the appended claims can be combined with the subject matter of another claim to provide a solution for a catadioptric projection objective. The present invention is intended to embrace all such alternatives, modifications and variances that fall within the scope of the appended claims.

What is claimed is:

1. A catadioptric projection objective comprising:
    an object plane;
    a physical beam splitter;
    a concave mirror;
    an image plane;
    a first objective part being located between said object plane and said physical beam splitter;
    a second objective part being located between said physical beam splitter and said concave mirror, and including at least two divergent lenses; and
    a third objective part being located between said physical beam splitter and said image plane.

2. The catadioptric projection objective according to claim 1, wherein said at least two divergent lenses are spatially separated in said second objective part.

3. A catadioptric projection objective comprising:
    an object plane;
    a physical beam splitter;
    a concave mirror;
    an image plane;
    a first objective part being located between said object plane and said physical beam splitter;
    a second objective part, being located between said physical beam splitter and said concave mirror; and
    a third objective part being located between said physical beam splitter and said image plane,
        wherein the catadioptric projection objective has a chromatic length aberration (CHL);
        wherein said second objective part is over-corrected with regard to said CHL,
        wherein said first and third objective parts are under-corrected with regard to said CHL, and
        wherein said over-correction of said second objective part, in double passage of a beam of light, compensates for at least 70% of said under-correction of said first and third objective parts.

4. The catadioptric projection objective according to claim 3, wherein said second objective part has a negative refractive power.

5. The catadioptric projection objective according to claim 4,
    wherein said concave mirror has a refractive power, and
    wherein said refractive power of said second objective part is in a range of about 40% to about 80% of said refractive power of said concave mirror.

6. The catadioptric projection objective according to claim 3, wherein said second objective part comprises at least one positive lens.

7. The catadioptric projection objective according to claim 6,
    wherein said seconds objective part includes a first negative lens and a second negative lens, and
    wherein said at least one positive lens is located between said first negative lens and staid second negative lens.

8. The catadioptric projection objectives according to claim 3, wherein said second objective part includes a diaphragm plane located therein.

9. The catadioptric projection objective according to claim 3, wherein said concave mirror includes a diaphragm plane located thereon.

10. The catadioptric projection objective according to claim 3, wherein said first objective part has a positive refractive power.

11. The catadioptric projection objective according to claim 3, wherein said third objective part has a positive refractive power.

12. The catadioptric projection objective according to claim 3,
wherein said first objective part directs a beam towards said physical beam splitter, and
wherein said beam is at an angle of less than 10 degrees relative to ah optical axis at a surface of said physical beam splitter.

13. The catadioptric projection objective according to claim 3,
wherein said second objective part and said concave mirror cooperate to direct a beam towards said physical beam splitter, and
wherein said beam is at an angle of less than 10 degrees relative to an optical axis at a surface of said physical beam splitter.

14. The catadioptric projection objective according to claim 3,
wherein said concave mirror has a usable diameter, and
wherein said second objective part has a focal length that is at least triple said usable diameter.

15. The catadioptric projection objective according to claim 3,
wherein said first objective part has a Petzval sum ($P_1$),
wherein said second objective part has a Petzval sum ($P_2$),
wherein said third objective part has a Petzval sum ($P_3$),
wherein said concave mirror has a Petzval sum ($P_c$) and
wherein $P_1$, $P_2$, $P_3$ and $P_c$ satisfy the equation:

$$2 \times (P_2) + P_c = -(90 \text{ to } 110)\% \times (P_1 + P_3).$$

16. The catadioptric projection objective according to claim 3,
wherein said second objective part has a Petzval sum in double passage,
wherein said second objective part is over-corrected relative to said, Petzval sum,
wherein said first and third objective parts are under-corrected relative to said Petzval sum, and
wherein said over-correction of said second objective part compensates for at least 90% of said under-correction of said first and third objective parts.

17. The catadioptric projection objective according to claim 3,
wherein said third objective part has an image-side lens surface, and
wherein said image-side lens surface and said image plane are separated by a distance of >5 mm.

18. The catadioptric projection objective according to claim 3, wherein said third objective part is refractive.

19. The catadioptric projection objective according to claim 3, wherein the catadioptric projection objective has a reduction β, in a range of about 4:1 through about 6:1.

20. The catadioptric projection objective according to claim 3, wherein said third objective part includes a diaphragm plane.

21. The catadioptric projection objective according to claim 3, wherein said first objective part has a first principal axis that passes through said object plane.

22. The catadioptric projection objective according to claim 3, wherein the catadioptric projection objective is centered around a first optical axis and a second optical axis.

23. The catadioptric projection objective according to claim 3, wherein said object plane is impinged by a chief ray at 0°±20 mrad.

24. The catadioptric projection objective according to claim 3, wherein said first objective part comprises at least one positive field lens.

25. The catadioptric projection objective according to claim 3, wherein said over-correction of said second objective part, in double passage of a beam of light, compensates for at least 85% of said under-correction of said first and third objective parts.

26. The catadioptric projection objective according to claim 3, further comprising a deflecting mirror for deflecting a beam from said object plane to said physical beam splitter.

27. The catadioptric projection objective according to claim 3, further comprising a deflecting mirror for deflecting a beam from said physical beam splitter to said image plane.

28. The catadioptric projection objective according to claim 3, wherein at least one of said first objective part, said second objective part, said third objective part and said concave mirror comprises a lens having an aspherical surface.

29. The catadioptric projection objective according to claim 3, wherein said physical beam splitter is a beam-splitter prism with a polarization-dependent, reflective layer system.

30. The catadioptric projection objective according to claim 3, wherein said physical beam splitter is a beam-splitter prism with a polarization-dependent, transmitting layer system.

31. The catadioptric projection objective according to claim 3, wherein said physical beam splitter is an obliquely positioned plate.

32. The catadioptric projection objective according to claim 3, wherein said third objective part includes an intermediate image.

33. A catadioptric projection objective comprising:
an object plane;
a physical beam splitter;
a concave mirror;
an image plane;
a first objective part being located between said object plane and said physical beam splitter;
a second objective part being located between said physical beam splitter and said concave mirror; and
a third objective part being located between said physical beam splitter and said image plane, and including an intermediate image.

34. The catadioptric projection objective according to claim 33,
wherein said third objective part includes a first lens and a second lens, and
wherein said intermediate image is located between said first lens and said secondlens.

35. The catadioptric projection objective according to claim 33,
wherein the catadioptric projection objective has an image ratio between said object plane and said intermediate image, and
wherein said image ratio is in the range of 1.0±0.7.

36. The catadioptric projection objective according to claim 33, wherein said third objective part includes a lens having a positive refractive power, and wherein said lens is located between said physical beam splitter and said intermediate image.

37. The catadioptric projection objective according to claim 33, wherein said third objective part includes a lens system located between said intermediate image and said image plane, and wherein said lens system has an image ratio of less than 1.

38. The catadioptric projection objective according to claim 33, wherein said third objective part includes a lens system located between said intermediate image and said image plane, and wherein said lens system includes a lens having an aspherical surface.

39. The catadioptric projection objective according to claim 33, wherein said second objective part includes a first diaphragm plane, wherein said third objective part includes a lens system located between said intermediate image and said image plane, and wherein said lens system includes a second diaphragm plane.

40. The catadioptric projection objective according to claim 39, wherein said first and second diaphragm planes have different diameters, and wherein a greater of said different diameters is larger than a smaller of said different diameters by a factor of $\leq 1.5$.

41. The catadioptric projection objective according to claim 33, wherein the catadioptric projection objective is telecentric in at least one of said object plane and said image plane.

42. The catadioptric projection objective according to claim 33, wherein said catadioptric projection objective comprises a plurality of lenses, and wherein all of said plurality of lenses are comprised of a same material.

43. The catadioptric projection objective according to claim 33, wherein said catadioptric projection objective comprises a lens that passes a beam of light having a wavelength ($\lambda$), and wherein said lens is comprised of a material based on said wavelength ($\lambda$) in accordance with the equations:
for $180 \leq \lambda \leq 250$ nm, use $SiO_2$;
for $150 \leq \lambda \leq 200$ nm, use $CaF_2$;
for $\lambda < 160$ nm, use alkali fluoride.

44. The catadioptric projection objective according to claim 33, wherein said catadioptric projection objective comprises a lens that passes a beam of light having a wavelength ($\lambda$), wherein 150 nm $\leq \lambda \leq$ 250 nm, and wherein said lens is comprised of a material selected from the group consisting of $SiO_2$, $CaF_2$, $BaF$, and combinations thereof.

45. A projection exposure device for microlithography, comprising:

the catadioptric projection objective of claim 1, an illumination system having a light source illuminating said object plane of said catadioptric projection objective; and a mask being positioned on a first carrier system, said mask being positioned in said object plane of the catadioptric projection objective;

wherein the catadioptric projecting objective projects said mask onto a light sensitive object on a second carrier system, which lies in said image plane of the catadioptric projection objective.

46. A process for producing a semiconductor comprising the step of employing the projection exposure device of claim 45.

47. A projection exposure device for microlithography, comprising:

the catadioptric projection objective of claim 3, an illumination system having a light source illuminating said object plane of said catadioptric projection objective; and mask being positioned on a first carrier system, said mask being positioned in said object plane of the catadioptric projection objective;

wherein the catadioptric projecting objective projects said mask onto a light sensitive object on a second carrier system, which lies in said image plane of the catadioptric projection objective.

48. A process for producing a semiconductor comprising the step of employing the projection exposure device of claim 47.

49. A projection exposure device for microlithography, comprising:

the catadioptric projection objective of claim 33, an illumination system having a light source illuminating said object plane of said catadioptric projection objective; and a mask being positioned on a first carrier system, said mask being positioned in said object plane of the catadioptric projection objective;

wherein the catadioptric projecting objective projects said mask onto a light sensitive object on a second carrier system, which lies in said image plane of the catadioptric projection objective.

50. A process for producing a semiconductor comprising the step of employing the projection exposure device of claim 49.

* * * * *